United States Patent

Kobayashi et al.

[11] Patent Number: 5,221,859
[45] Date of Patent: Jun. 22, 1993

[54] LEAD FRAME FOR SEMICONDUCTOR DEVICE

[75] Inventors: Shiro Kobayashi; Narutoshi Kazama, both of Hitachi; Masahiko Itoh, Hitachioota; Noriyuki Ohnaka, Katsuta, all of Japan

[73] Assignee: Hitachi, Ltd., Tokyo, Japan

[21] Appl. No.: 660,944

[22] Filed: Feb. 26, 1991

[30] Foreign Application Priority Data

Feb. 26, 1990 [JP] Japan .................................. 2-42466

[51] Int. Cl.⁵ .................... H01L 23/28; H01L 23/48; H01L 29/44
[52] U.S. Cl. .................................. 257/676; 257/677; 361/421; 174/52.2
[58] Field of Search ................ 357/70, 72; 257/676, 257/677; 361/421; 174/52.2

[56] References Cited

U.S. PATENT DOCUMENTS

| | | | |
|---|---|---|---|
| 3,839,660 | 10/1974 | Stryker | 357/74 |
| 4,785,137 | 11/1988 | Samuels | 357/72 |
| 4,894,752 | 1/1990 | Murata et al. | 357/70 |
| 4,942,454 | 7/1990 | Mori et al. | 357/72 |
| 4,974,052 | 11/1990 | Ichiyama | 357/72 |
| 5,010,388 | 4/1991 | Sasame et al. | 357/70 |

FOREIGN PATENT DOCUMENTS

0049382 7/1988 Japan .
0169056 11/1988 Japan .

Primary Examiner—Rolf Hille
Assistant Examiner—David Ostrowski
Attorney, Agent, or Firm—Antonelli, Terry, Stout & Kraus

[57] ABSTRACT

A lead frame of a plastic encapsulated type semiconductor device is provided with a coating film which has a solderability higher than a solderability of a basic metal of the lead frame, and the coating film has a corrosion potential higher than a corrosion potential of the basic metal. The coating film protects the basic metal from corrosion caused by the plastic encapsulated member. The coating film of the lead frame made of a Fe-Ni alloy is an alloy comprising metal selected from Mo, W, Au, Cr, Cu, metals of the platinum group and a metal selected from Fe, Co, and Ni.

4 Claims, 4 Drawing Sheets

LEAD FRAME FOR SEMICONDUCTOR DEVICE

BACKGROUND OF THE INVENTION

1. Field of the Invention

The present invention relates to a novel plastic encapsulated type semiconductor device and a lead frame comprising Fe-Ni group alloy used for the same.

2. Description of the Prior Art

Two kinds of materials of Cu alloy and Fe-Ni group alloy are used mainly as materials for a lead frame of a plastic encapsulated type semiconductor device. The two kinds of materials have features that, while the former has good thermal conductivity and almost equal thermal expansion coefficient to a resin for encapusulation, the latter has superior oxidation resistance and almost equal thermal expansion coefficient $(4.0 \sim 10.0 \times 10^{-6} K^{-1})$ to Si (thermal expansion coefficient: $3.6 \times 10^{-6} K^{-1}$) etc. Currently, accompanying with higher integration of a semiconductor chip, there is a tendency to increase heat generated from a semiconductor tip and to enlarge the size of a semiconductor chip. A lead frame made of Cu alloy is suitable for mounting of a semiconductor chip having large heat generation rate and relatively small size, but for mounting of a semiconductor chip having larger size, the lead frame has a disadvantage in that cracks develop on a device owing to a stress induced by a difference of thermal expansion of the lead frame and the semiconductor chip. Therefore, as a lead frame for mounting of a semiconductor chip of larger size, a lead frame made of Fe-Ni alloy is preferable. But, alloys by prior art such as 42% alloy (42% Ni, residual Fe) and 50% alloy (50% Ni, residual Fe) are inferior to a Cu alloy in corrosion resistance, adhesiveness with a resin, and solderability.

As to means for solving problems of the lead frame made of Fe-Ni alloy, a method to add a chemical element such as Cu to the alloy to improve the characteristics of the alloy itself is disclosed in the JP-A-63-169056 (1988), and another method to put a plating layer of Cu on surface of the lead frame to improve the characteristics of surface of the lead frame is disclosed in the JP-A-63-169056 (1988), and further a method to form a coating film of Ni, Co, Au, Ag, and Cu alloy containing Pd more than 40% is disclosed in the JP-B-63-49382 (1988).

Among the prior arts described above, either of a method to add a chemical element such as Cu etc. to a Fe-Ni alloy and a method to put a metallic layer such as Cu plating layer etc. on surface of a lead frame, are effective in improving corrosion resistance and adhesiveness with a resin of the lead frame. Nevertheless, the former method has a disadvantage of increased thermal stress in the lead frame and the semiconductor tip owing to the increment of thermal expansion coefficient by adding of a chemical element to the alloy, and the latter method has another disadvantage of lowered solderability owing to an oxidation of Cu on the surface of the lead frame in a process of packaging. And, a current trend of high integration needs increasingly higher reliability of a semiconductor package, especially a technique to prevent a crevice corrosion which will be generated at an interface of a lead frame and a resin is indispensable for improvement of reliability on humidity protection. Nevertheless, the prevention of the crevice corrosion was not considered in the prior art. Further, a coating film containing Pd more than 40% has defects when the coating film is formed by plating, and a problem has been existing that the defects accelerate corrosion.

SUMMARY OF THE INVENTION

One of the objects of the present invention is to provide a semiconductor device which has an improved corrosion resistance, especially an improved corrosion resistance against a crevice corrosion by a encapsulation resin, and an increased solderability without any spoiling of thermal expansion characteristics and of oxidation resistance of the lead frame made of Fe-Ni group alloy, and to provide a lead frame used for the semiconductor package.

The present invention relates to a semiconductor device comprising a semiconductor chip, a lead frame which conducts an electrical signal outside from the semiconductor chip, and a plastic encapsulated member which insulates the semiconductor chip from the atmosphere, wherein the lead frame has a coating film having a better corrosion resistance against corrosion by the plastic encapsulated member than a basic metal of the lead frame, a solderability at least equal to the basic metal, and a corrosion potential at least higher than a corrosion potential of the basic metal of the lead frame.

The present invention is achieved by a lead frame comprising an alloy layer which is composed of a first metal selected from a metal nobler than Ni and a second metal having a solderability at least equal to the basic metal of the lead frame and has a corrosion potential at least higher than the corrosion potential of the basic metal, concretely saying, by a lead frame comprising an alloy layer which is composed of a first metal at least selected from Mo, W, Cr, Au, Ag, Cu, Pt, Pd, Rh, Ru, Ir and Os, and a second metal at least selected from Fe, Co, and Ni, and the alloy having less than 30% by weight of the first metal described above, further the alloy having less than 30% by weight of at least one of Sn and Zn additionally, and by having an oxide film comprising an oxide of a metal at least selected from Mo, W and Cr, and an oxide of basic metal of the lead frame.

Further, a lead frame related to the present invention is achieved with a plastic encapsulated member containing a chemical compound which forms a protecting film having corrosion resistance against corrosion by the plastic encapsulated member on a surface of the lead frame.

The present invention relates to a lead frame having a coating film on the surface of the lead frame, which has a better corrosion resistance by the plastic encapsulated member than the basic metal of the lead frame, a solderability at least equal to the basic metal, and a corrosion potential at least higher than a corrosion potential of the basic metal. The corrosion potential is an index to indicate a degree of corrosiveness. A lead frame relating to the present invention is composed of formation of a special alloy layer or a special oxide layer. And, especially, the present invention is preferable to a lead frame which comprises a flat thin plate of a basic metal which is stamped out and fabricated into a designated shape in order to mount a plurality of semiconductor chips, and a transfer mechanism in order to form a semiconductor device by assembling the semiconductor chips automatically on the fabricated flat thin plate of the basic metal.

And, the present invention relates to a tape which is not fabricated into a designated shape as a lead frame, and is rolled around a drum frame, and has a coating film relating to the present invention on whole surface of the tape. The tape is used as a flattened member by cutting and fabricating to a designated shape and a designated size.

A crevice corrosion is a case of a decrease in reliability of humidity protection of a plastic encapsulated type semiconductor package and generated by an effect of water which is penetrated into an interface of a lead frame and a plastic encapsulated member and a corrosive anion such as $Cl^-$ and $Br^-$ etc. is presumably considered. A crevice corrosion is a local corrosion phenomenon which proceeds with increasing speed on account of breakdown of a passive film on a metal in the crevice by $Cl^-$ etc. and further, with lowered pH in the crevice and concentration of the corrosive anion. Fe-Ni alloy has a weaker resistance to a crevice corrosion than Cu alloy, and lowering the reliability of humidity protection is a problem.

To improve the resistance against the crevice corrosion of Fe-Ni alloy, two methods are presumably available such as a method to add a nobler metal than Fe ($-0.440$) and Ni ($-0.250$) as an alloy component and another method to form a metallic layer comprising nobler metal described above on the surface of the Fe-Ni alloy. In the former method, although a necessary weight of an additive metal is about 1~5%, the addition of the additive metal causes about 5~50% increment of thermal expansion coefficient, and consequently, results in increment of thermal stress between a tip and a lead frame. Therefore, a Fe-Ni alloy lead frame which is added an alloy element is not suitable as a lead frame for mounting large size chips. On the other hand, the latter method improves only a characteristics of an alloy surface without effecting to the characteristics of thermal expansion. Accordingly, a Fe-Ni alloy lead frame having a metallic layer which comprises nobler metals such as Cu, Mo, and Pd etc. than Fe and Ni on the surface is preferable as a lead frame for mounting large size chips.

Although Cu is an chemical element to increase corrosion resistance of Fe-Ni alloy surface, Cu by itself decreases resistance to oxidation at high temperature, and consequently, lowers solderability by oxidation of the surface of the lead frame during a packaging process. Therefore, Cu is able to be used for improvement of corrosion resistance and resistance to oxidation only by mixing with at least one of Fe, Ni, and Co.

Noble metal elements such as Pd, Pt, Au, Ag, etc. are effective in improving all of corrosion resistance, oxidation resistance, and solderability.

A Fe-Ni alloy lead frame having an alloy layer of a nobler metal than Ni such as Mo, W, and Cr, etc. with a metal such as Sn and Zn which are not spoiling wedge bondability of the basic metal of the lead frame is improved in both of corrosion resistance and oxidation resistance.

Especially, taking Mo as an example, the improvement in crevice corrosion resistance is achieved owing to an effect of $MoO_4^{2-}$ which is obtained from Mo to remedy a local solute pit in the crevice. The effect is considered to be caused that $MoO_4^{2-}$ reacts with the local solute pit and yields an almost insoluble compound such as $FeMoO_4$, $NiMoO_4$, $MoO_2$, $MoO_3$, etc. at the local solute pit, or that a noble metal described above is concentrated at the surface of the lead frame and protects the local solute pit by covering the spot with a coating film. The thickness of the coating film is preferably $10Å$~$0.1$ $\mu m$, and especially $100Å$~$0.1$ $\mu m$ is preferable.

A concentration of a noble metal such as Mo etc. in an alloy layer is able to be controlled with a concentration of a noble metal compound such as $MoO_4^{2-}$ in a plating solution. Although the higher concentration of noble metal such as Mo etc. in the alloy layer is preferable in view of improving corrosion resistance, it is concerned to induce lowering of a bondability and solderability. Therefore, the necessary concentration of the noble metal to improve corrosion resistance without lowering of the bondability and solderability is less than 30% by weight or 20% by weight, especially 1~10% by weight, preferably 2~5% by weight. Especially, Ni alloy comprising 0.5~5% of Pt group metal and 1~3% of Mo is preferable. And, optimum concentrations of Sn and Zn are less than 30%, and preferably in a range of 1~10% for Sn and 3~15% for Zn in aspect of solderability and adhesiveness with a encapsulation resin. And the main residual component in the metallic layer is Fe, Co, or Ni. Accordingly, an alloy plating layer comprises any of Fe, Ni, and Co by itself or at least any one of Fe, Ni, and Co, and the alloy plating layer contains the elements described above by more than 80% by weight, preferably 85~98% by weight. By making the composition of the alloy as the one as described above, the corrosion potential of the alloy can be maintained at least as high than the corrosion potential of the basic metal, and corrosion can be prevented. Especially, even with a case wherein an alloy layer is consisted with a coating film having a thickness thinner than 0.1 $\mu m$ and a rate of forming defects is high, an effect to prevent corrosion is valid.

As the corrosion potential of the 42 alloy is nearly zero volt, a better result is obtained with maintaining the corrosion potential of the alloy 0.02~0.15V higher than the corrosion potential of the 42 alloy, especially 0.06~0.1 is preferable.

To form an alloy plating layer, one of the surface treatment methods such as an electroplating, a hot dipping, and a vapor plating method is available. Since Mo and W are metals having high melting points, the hot dipping is not available. A gas phase plating such as a chemical vapor deposition and a physical vapor deposition etc. is applicable to the plating of Mo and W, but the gas phase plating has a disadvantage of a slow plating speed.

On the other hand, although the electroplating is not available for the plating of the pure Mo and W, a formation of an alloy plating layer is possible by the electroplating with using a plating bath of co-existing ions of metals such as Ni, Fe, Co, Sn, Zn, etc. and $MoO_4^{2-}$ or $WoO_4^{2-}$ for co-plating with Mo or W.

An alloy plating layer containing Mo or W is formed by a simultaneous reduction of the metals described above and $MoO_4^{2-}$ or $WoO_4^{2-}$. By using Ni and Fe among the metals wherewith a co-plating of Mo or W is possible and has no problems because the Fe-Ni alloy has the same composition with the basic metal, but an alloy plating layer having a higher Ni content is more corrosion resistant. While, both of Sn and Zn are adequate as components of an alloy layer because an improvement in solderability can be expected. Therefore, a plating bath contains the necessarily $MoO_4^{2-}$ or $WO_4^{2-}$ and at least one of metal ions selected from $Fe^{2+}$, $Co^{2+}$, $Ni^{2+}$, $Sn^{2+}$, $Zn^{2+}$. The thickness of the alloy layer is preferably 0.02~10 $\mu m$, and especially 0.1~5 $\mu m$, however 1~3 $\mu m$, is preferable.

The formation of a layer of hardly soluble Mo compounds such as $FeMoO_4$, $NiMoO_4$, $MoO_2$, $MoO_3$, etc., a layer of hardly soluble W compounds such as $FeWO_4$, $NiWO_4$, $WO_2$, $WO_3$, etc., and a layer of Cr compounds such as $FeCrO_4$, $NiCrO_4$, etc., on the surface of the Fe-Ni alloy is effective to inhibit crevice corrosion by the effects of employing $MoO^{2-}_4$, $WO^{2-}_4$, and $CrO^{2-}_4$ similar to the alloys containing Mo etc. The layers of Mo compounds, W compounds, and Cr compounds, described above can be formed by a dipping treatment of the Fe-Ni alloy in an aqueous solution containing $MoO^{2-}_4$, $WO^{2-}_4$, and $CrO^2O_4$. The reliability of humidity protection of a semiconductor device can be improved by using a lead frame which had been treated with the dipping treatment described above directly for a semiconductor package, or by performing the dipping treatment of a semiconductor device itself which was encapsulated with a resin after chip bondings and wire bondings on a lead frame of Fe-Ni alloy was performed, in an aqueous solution containing $MoO^{2-}_4$, $CrO^{2-}_4$, or $WO^{2-}_4$. But, an existence of metal oxides described above on a surface of the lead frame has a possibility to lower a bondability and a solderability.

And an encapsulant of a lead frame of Fe-Ni alloy with a resin containing at least one of water soluble salts of molybdic acid ($MoO^{2-}_4$), tungstenic acid ($WO^{2-}_4$), and chromic acid ($CrO^{2-}_4$) has an effect to prevent crevice corrosion because an ion, that is at least one of $MoO^{2-}_4$, $WO^{2-}_4$, and $CrO^{2-}_4$, is dissolved into water which will be soaked into an interface between the lead frame and the resin, and will react with the surface of the lead frame to form a layer of Mo compound, W compound, and Cr compound which are protective against corrosion by chloride ion and bromide ion which are contained in the resin. But, uniform dispersion of the molybdate salt etc. in the resin in necessary.

A Fe-Ni group alloy is used as a basic metal of a lead frame, and especially an alloy comprising Ni of 35~50% by weight and Fe of substantially all of residual and having a thermal expansion coefficient in a range of $4.0 \sim 10.0 \times 10^{-6} K^{-1}$ is preferable in consideration of a difference of thermal expansion coefficient with Si. The thickness of the alloy is less than 0.3 mm, and preferably in a range of 0.1~0.3 mm. A device using a Fe-Ni alloy lead frame having a Ni concentration or a thermal expansion coefficient beyond the upper limit of the range described above has a possibility of causing a breakage of the device because of a large thermal stress generated between the lead frame and a Si chip. The addition of chemical elements to Fe-Ni alloy for improvement of corrosion resistance, mechanical strength, and anti-oxidation property of the Fe-Ni alloy is possible with the accompanying increment of a thermal expansion coefficient being less than 10%. The addition of the elements is preferably less than 1% by weight. And Cu, Mo, W, Pt group elements, and Ag are preferable as additive elements.

Two methods of manufacture of a Fe-Ni alloy lead frame having a protective layer of Mo for corrosion resistance are available, one of the methods is a method to fabricate a Fe-Ni alloy plate into a shape of a lead frame by machining or etching and subsequently electroplating the lead frame by placing the lead frame as a cathode. Another method is to fabricate a Fe-Ni alloy plate, which has been electroplated, into a shape of a lead frame.

The humidity protection of the device is improved by using a Fe-Ni alloy lead frame, wherein a metallic layer containing noble metals such as Mo etc. as described above is formed, for a semiconductor device because of an effect of the metallic layer to prevent a crevice corrosion at an interface between the lead frame and the resin.

A resin including mainly a thermosetting epoxy resin is used as a encapsulated resin, and a quartz powder having an average diameter of 30~200 μm is added as a filler to lower the thermal expansion coefficient of the resin. Spherical quartz powder is preferable in view of the fluidity for manufacturing. The addition of the filler is 60~80% by volume. Additionally, silicone rubber is added to the encapsulation resin as an agent for giving flexibility, and the encapsulation resin wherein particles of the silicone rubber are dispersed is shaped and hardened, consequently lowering of a stress to the chip is realized becomes.

A wire made of Au, Al, Cu, and their alloys and having a diameter of 10~50 μm, especially preferably 25~35 μm, and an annealed wire is used as a bonding wire. The joining of the bonding wire to a semiconductor chip is performed by a ball bonding in a solid phase of an ultrasonic vibration and joining of the bonding wire to a lead frame is performed by a wedge bonding in the solid phase of the ultrasonic vibration.

The present invention provides a semiconductor device having the high humidity protection as described above by forming a layer of an alloy or a compound of noble metals such as Mo etc. and a metal having superior solderability on surface of the Fe-Ni group alloy lead frame to prevent a crevice corrosion at an interface of the lead frame and the resin. And, as the surface treatment in the embodiment of the present invention does not effect the low thermal expansion coefficient of Fe-Ni alloy, a semiconductor device having a large type chip of more than 100 mm$^2$ in chip size can be mounted. As the result, a personal computer of super small size, and a super small type computer instead of a medium or a small type computer for a terminal station in a bank becomes available.

BRIEF DESCRIPTION OF DRAWINGS

FIG. 5b is a perspective view of a semiconductor device using of the lead frame shown in FIG. 5a.

DETAILED DESCRIPTION OF THE EMBODIMENTS

Example 1

Figure 1:
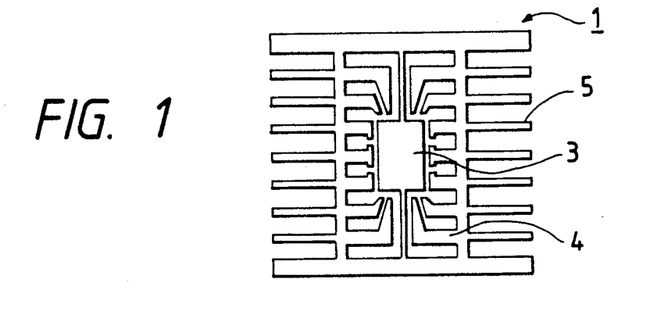
FIG. 1 is a top view of a lead frame relating to the present invention.

FIG. 1 is a top view of a dual in-line type lead frame for device having an alloy layer formed by the embodiment of the present invention.

Using a lead frame fabricated from an 42% alloy plate (42% Ni-residual Fe alloy) by etching to a designated shape as shown in FIG. 1 as a cathode, various alloy plating film shown in table 1 was formed on the whole surface of the lead frame with various plating solution shown in table 1.

An alloy plating of Ni-Mo-Sn of the present invention shown as No. 2 in table 1 was performed with an aqueous plating solution having a composition of 0.5 g/l $(NH_4)_6Mo_7O_{24}\cdot 4H_2O$ + 200 g/l $NiCl_2\cdot 6H_2O$ + 100 g/l $SnCl_2$ + 200 g/l $NH_4Cl$, and formed an alloy plating layer of Mo-Ni-Sn of about 3 μm thick on the whole surface of the lead frame by electroplating with a current density of 1 $A/dm^2$ in the aqueous plating solution (40° C.). All of the various alloy plating film had thickness of about 3 μm. In the present embodiment, no heat treatment was performed on the lead frame.

All of the alloy plating layers has corrosion potential of 0.02~0.1V in an aqueous NaCl solution of 0.01 mol/l (25° C.) and, as the corrosion potential of the base metal was nearly 0V, which is slightly higher potential than the base metal.

Figure 2A:
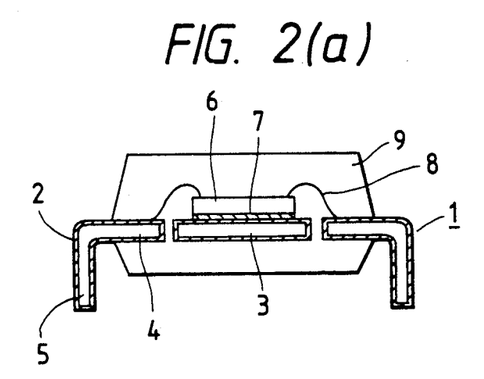
FIG. 2a is a section view of a semiconductor device relating to the present invention.
Figure 2B:
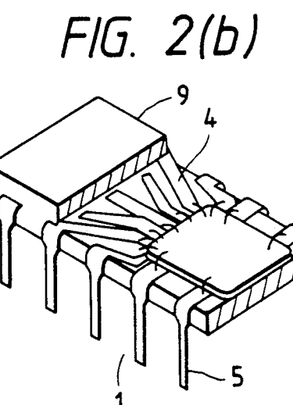
FIG. 2b is a perspective view of a semiconductor device relating to the present invention.

FIG. 2a and 2b are a section view and a perspective view respectively of a semiconductor device using a lead frame which was formed with one of various alloy plating layers 2 shown as No. 1 to No. 6 in table 1 as described above. One of various alloy plating layers as described above was formed on the whole surface of the lead frame 1 consisted of 42% alloy, and a Si chip 6 having 100 $mm^2$ in chip area of a circuit forming surface was soldered with a solder 7 on a mounting portion 3 of the lead frame 1. Subsequently, an Al electrode pad on the Si chip 6 and an inner lead portion 4 on the Si chip 6 were plated partially with Ag, and after a bonding between the Al electrode pad and the inner lead portion 4 was completed with an Au wire 8 by ball bonding to the Al electrode pad and by wedge bonding to the inner lead portion 4, a molding with epoxy resin was completed. The partial Ag plating was electroplated only onto the bonding portion with using a mask. And in some cases, the wedge bonding was completed without the Ag plating. Owing to an effect of the alloy plating layer 2 which contains Mo, a crevice corrosion between the lead frame 1 and the epoxy resin 9 is prevented and the humidity protection of the semiconductor is improved.

Figure 3:
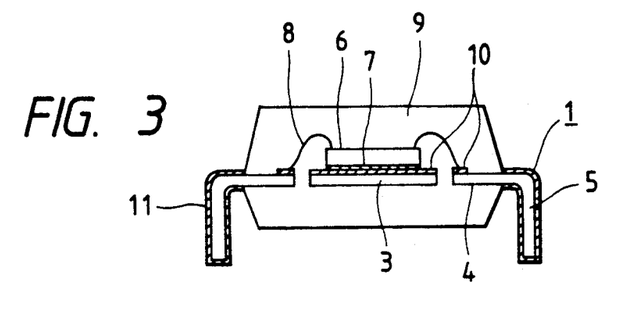
FIG. 3 and FIG. 4 are section views of semiconductors relating to the other embodiments of the present invention.

An embodiment of the present invention shown as No. 7 in table 1 had a structure as shown in FIG. 3.

FIG. 3 is a section view of a semiconductor device which was manufactured with steps of a soldering of a Si chip onto the lead frame as described above, a molding with epoxy resin, and a dipping treatment in an aqueous solution of molybdic acid. After only an inner lead portion 4 and a chip mounting portion 3 of the lead frame 1 consisted of 42% alloy were plated partially with Ag, a chip bonding, a wire bonding, and molding with resin were performed. Subsequently, the lead frame was treated by dipping with an aqueous solution of $Na_2MoO_4$ 10 g/l (pH 4, 60° C.) and layer of composite compounds 11 having a thickness of hundreds Å and a composition of $FeMoO_4$, $NiMoO_4$, $MoO_2$, and $MoO_3$ was formed on an outer lead portion 5 of the lead frame 1, and rinsed. The layer of the composite compounds 11 is effective in preventing of a crevice corrosion at an interface between the lead frame 1 and the resin 9. The thickness of the layer of the composite compounds 11 in the present embodiment is preferably hundreds Å so as to be deleted with a solder flux when an outer lead portion is soldered to a print base plate. And, No. 8 in table 1 was an example which was manufactured with a lead frame of 42 alloy, and molding with epoxy resin containing 3% by weight of $Na_2MoO_4$ to be a structure shown in FIG. 2a.

In examples of prior art, an example of a treatment free used 42 alloy for a lead frame without any treatment of coating film, and used a molding resin without any special additives. And, another example of a Cu plating used a lead frame having about 3 μm thick Cu plating film which was electroplated on the 42% alloy.

The examples obtained by the embodiments of the present invention and the prior art as described above were tested on reliability on humidity resistance, wire wedge bondability, outer lead solderability, and thermal shock resistance, and the results except the bondability are shown in table 1 and 2.

In a test for humidity protection, a burnout life of wire of a package, which was pre-dipped into an aqueous solution of 1% NaCl, was measured under a condition of working at 65° C. in 95% PH (relative humidity).

The wire wedge bondability was evaluated with a measurement of peeling strength as a strength of bonding of an Au wire having 30 μm of diameter to a lead frame by ultrasonic wedge bonding.

In the evaluation of the outer lead solderability, a fraction of wet area was measured after soldering an outer lead of a plastic encapsulated device with 65% Pb-35% Sn solder at 240° C. by Dape method.

The thermal shock resistance was evaluated with an observation of an outer appearance of a resin sealed device after rapid warning up to 400° C. by laser heating of an outer lead of the resin sealed package.

As a humidity protection life, each of all examples of No. 1 to No. 5 of the present embodiments has a life more than 250 hours, and all examples are superior to the treatment free example of the prior art (No. 9) which has a life of less than 100 hours. And the outer lead solderability of the lead frames of the present invention (No. 1 to No. 6), which have been performed the treatment of Mo containing alloy plating, are more than 70% and preferable. A lead frame (No. 7), whereof whole surface was treated as same as the example (No. 5) in an aqueous solution of a molybdate salt except without the Ag plating, has a little weaker bonding property and a little lower solderability equal to an example of Cu plating which has a value of more than 50%. Although the example having Cu plating on the whole surface (No. 10) is improved in humidity protection life, the solderability of the example is inferior to the examples having alloy plating of the present invention because of oxidation of the outer lead portion in plastic molding process. The peeling strength of wedge bonding of the example having Ag plating of the prior art was high as about 12.5 g, and examples of the present invention having Ag plating had also nearly the same peeling strength as the example of prior art. While, examples containing Sn and Zn had a peeling strength more than 11 g without Ag plating even though a little lower than the examples having Ag plating.

Table 2 indicates that, while both of a lead frame having Cu as one of composition of an alloy (No. 11) and a lead frame of Cu base (No. 12) case cracks in the device because of a large thermal stress by a thermal shock between the lead frame and the Si chip, the example of the present invention (No. 1) and the example of treatment free (No. 9) both of which have the same thermal expansion coefficient with 42 alloy did not cause any cracks.

As described above, superiority of the lead frame and the semiconductor device relating to the present invention in humidity protection, bondability, solderability, and thermal shock resistance are indicated.

TABLE 1

| | No. | Lead frame surface treatment | Main composition of treatment solution | Composition of coating film (% wt.) | Humidity resistance life (h) | Outer lead soldering property |
|---|---|---|---|---|---|---|
| Present invention | 1 | Ni—Mo alloy plating | NiSO$_4$ Na$_2$MoO$_4$ | 5% Mo, Residual Ni | >500 | 70~80% |
| | 2 | Ni—Mo—Sn alloy plating | NiSO$_4$ SnCl$_2$ Na$_2$MoO$_4$ | 5% Mo, 5% Sn Residual Ni | >500 | 90~95% |
| | 3 | Ni—Mo—Zn alloy plating | NiSO$_4$ ZnCl$_2$ Na$_2$MoO$_4$ | 5% Mo, 5% Zn Residual Ni | >500 | 90~95% |
| | 4 | Ni—W alloy plating | NiSO$_4$ Na$_2$MoO$_4$ | 5% W, Residual Ni | >500 | 70~80% |
| | 5 | Ni—Pd alloy plating | NiSO$_4$ PdCl$_2$ | 20% Pd, Residual Ni | >500 | 90~95% |
| | 6 | Fe—Mo—Sn alloy plating | FeSO$_4$ SnCl$_2$ Na$_2$MoO$_4$ | 5% Mo, 5% Sn Residual Fe | 400 | 80~90% |
| | 7 | Dipping treatment in molybdic acid salt aq. solution | Na$_2$MoO$_4$ | NiMoO$_4$, MoO$_2$ FeMoO$_4$ | 350 | 60~70% |
| | 8 | Molybdic acid salt added resin sealing | 3% Na$_2$MoO$_4$ addition | NiMoO$_4$, MoO$_2$ FeMoO$_4$ | 250 | 60~70% |
| Prior art | 9 | Treatment free | — | — | <100 | 60~70% |
| | 10 | Cu plating | — | Cu | >500 | 50~60% |

TABLE 2

| | No. | Composition of lead frame (% wt.) | Lead frame surface treatment | Thermal shock test | Thermal expansion coefficient (10$^6$/K) |
|---|---|---|---|---|---|
| Present invention | 1 | 42% Ni, Residual Fe | Ni—Mo plating | No change | 4.7 |
| Prior art | 9 | 42% Ni, Residual Fe | None | No change | 4.7 |
| | 11 | 42% Ni, 3% Cu, Residual Fe | None | Cracks generation | 4.7 |
| | 12 | 0.1% Zr, Residual Cu | None | Cracks generation | |

Example 2

Figure 4:
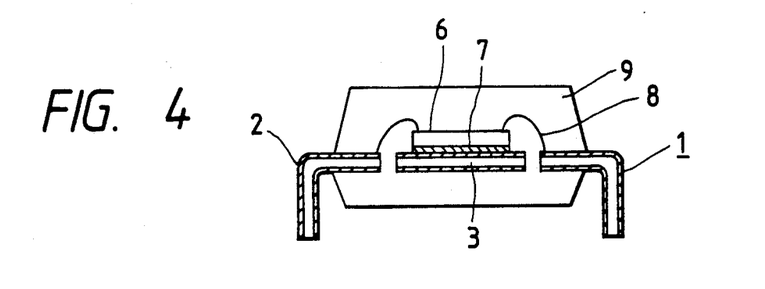

FIG. 4 is a section view of a semiconductor device using a lead frame which was fabricated from a plate of 3 mm thick of 42 alloy having a plating layer on surface of Mo-Ni-Sn alloy formed by the same method as the example 1. After forming the plating layer 2 of the Mo-Ni-Sn alloy on the surface of the 42 alloy plate, the lead frame 1 was fabricated by punching out from the 42 alloy plate in a shape as shown in FIG. 2, and the semiconductor device was manufactured.

In the present embodiment, although a cut side section of the lead frame was not coated with the plating layer, the area of the side section itself was far smaller than the area of the plane coated with the plating layer and humidity protection was improved.

Example 3

Figure 5A:
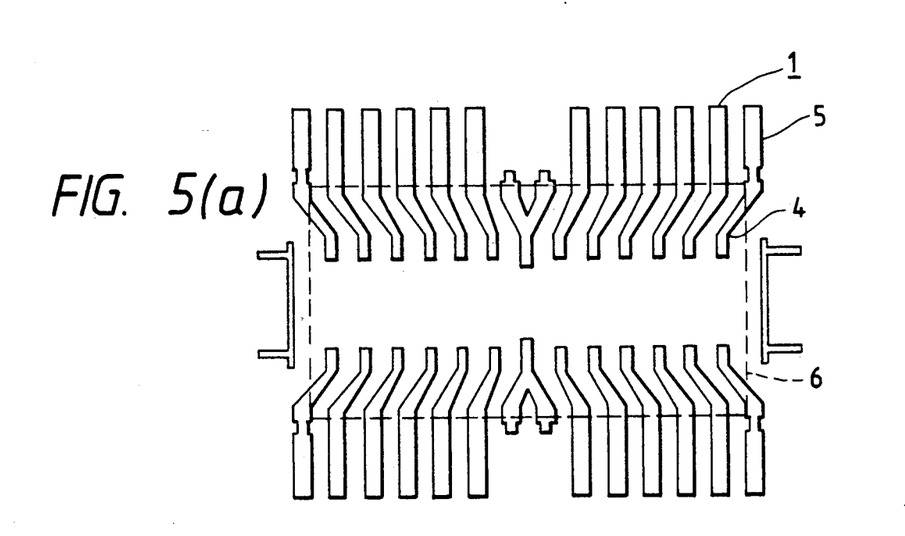
FIG. 5a is a top view of a lead frame relating to the another embodiment of the present invention.
Figure 5B:
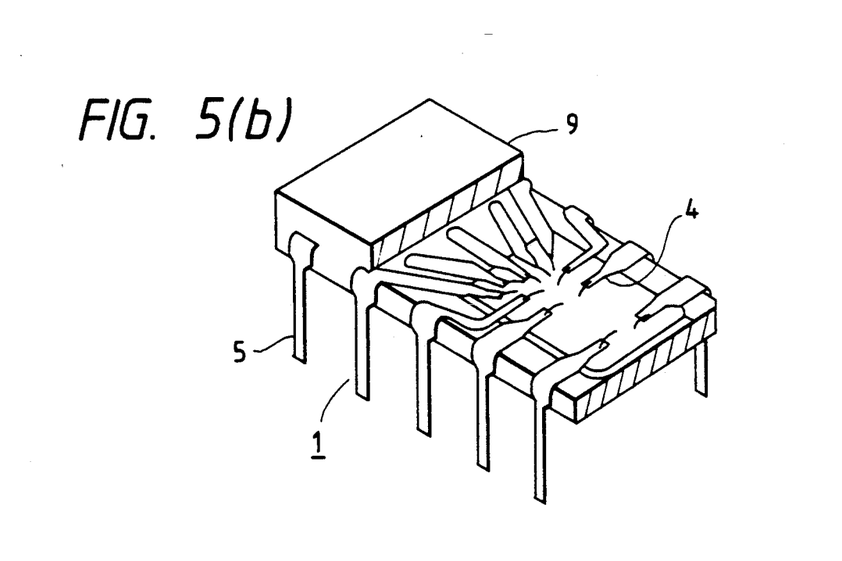

FIG. 5a is a schematic plan view illustrating another example of a lead frame made of 42% alloy for a dual-in-line type device in relating to the present invention, and FIG. 5b is a perspective view of a plastic encapsulated semiconductor device using the lead frame described above. The differences from the example 1 are as follows. The lead frame in the example 3 did not have a chip mounting portion, and an inner lead portion 4 was sealed with epoxy resin on a semiconductor chip 6 with an exposed outer lead portion 5 which was separated from the inner lead portion 4 with an insulation film.

The inner lead portion 4 and the semiconductor chip 6 were bonded by wedge bonding with the inner lead portion and by ball bonding with the semiconductor chip at the center of the semiconductor chip 6. In the present embodiment, alloy layers, oxide coating films, and addition of oxidizing agents to resin shown in table 1 are applicable as same as the embodiment 1.

A lead frame structure of the present embodiment is remarkably effective in application to a semiconductor device for a microprocessor having a memory capacity of 16M bits, 64M bits or more than 64M bits, and for a gate array having more than 10,000 arrays. As the lead frame has a structure which is enable to have an enough area of plastic encapsulated portion to fix a semiconductor chip even though the chip size is enlarged to more than 100 mm$^2$, a semiconductor device having a high reliability is obtainable.

Example 4

Figure 6:
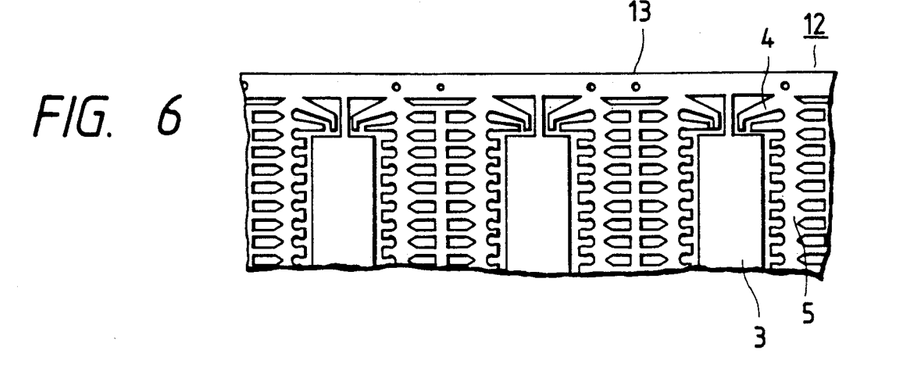
FIG. 6 is a partial perspective view of a lead frame plate relating to the present invention.

FIG. 6 is a perspective top view illustrating an example of a lead frame plate 12 relating to the present invention. A base metal of the present embodiment was a 42% alloy plate composed of 42% Ni-residual Fe of 0.3 mm thick as same as the example 1, and was fabricated to a designated length and shaped by an etching. In the present embodiment, the lead frame had an inner lead portion 4, an outer lead portion 5, and a chip mounting portion 3 having the same plane shape with a semiconductor tip. Further, the lead frame 1 was formed in a shape which enable the lead frame to be mounted with a plurality of the semiconductor tips, and has a sprocket 13 for a transferring mechanism so as to be transferred regularly for an automatic chip mounting and an automatic bonding etc. The lead frame plate 12 had 10 tips mounting portions 3.

The lead frame plate 12 of the present embodiment had a Ni-Mo-Sn alloy plating layer formed by the same method as the No. 2 in the example 1 on the whole surface. As for the alloy plating layer, an alloy plating layer having another composition can be properly used. Further, as the lead frame plate 12 having an alloy plating layer formed on the plate before the fabrication can be usable, a tape of 42% alloy whereon an alloy plating layer and a coating film related to the present invention are formed is applicable.

A lead frame plate as illustrated in FIG. 5a was fabricated as same as the lead frame plate shown in FIG. 6. In the case, a sprocket which was same as the one shown in FIG. 6 was formed, and a coating film was composed on the whole surface of the lead frame plate either of before and after of the fabrication.

Example 5

Figure 7:
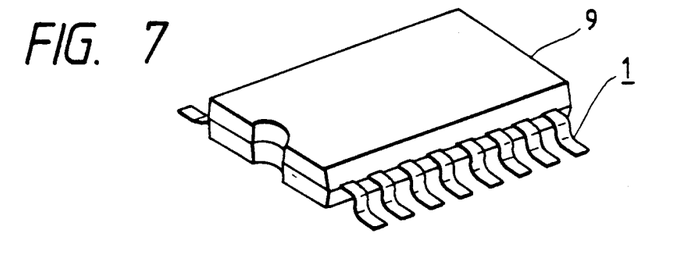
FIG. 7 and FIG. 8 are perspective views of semiconductor packages relating to the other embodiments of the present invention.
Figure 8:
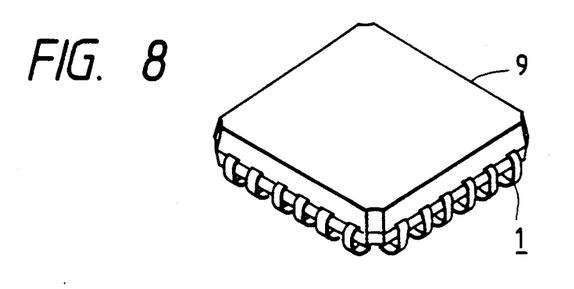

FIG. 7 is a perspective view of a small out-line device showing an embodiment of the present invention, and FIG. 8 is a perspective view of a plastic leaded chip carrier showing an embodiment of the present invention. As the lead frames 1 related to the embodiments described above, either of lead frames having a chip mounting portion and having no chip mounting portion as same as the example 3 and 4 were fabricated and coating films were formed. In the present embodiment, a lead frame having both of a superior resistance to a crevice corrosion and a good solderability was obtained.

Example 6

Figure 9:
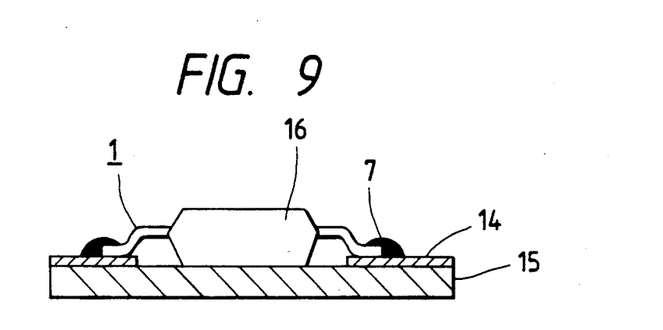
FIG. 9 is a section view of a surface mounting type device wherein a semiconductor device relating to the present invention is mounted on a print base plate.
Figure 10:
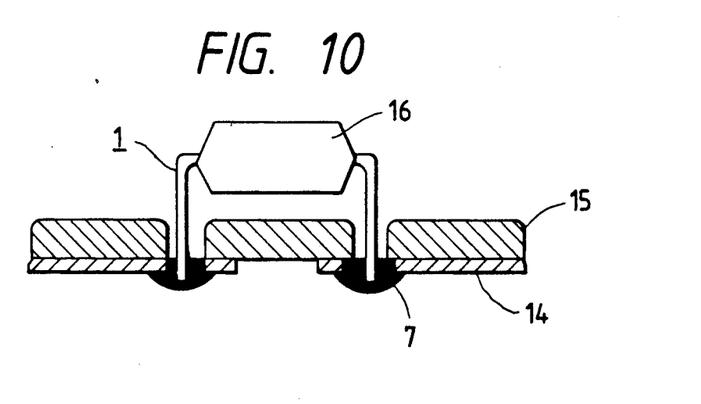
FIG. 10 is a section view of a lead inserting type mounting device wherein a semiconductor relating to the present invention is mounted on a print base plate.

FIG. 9 is a section view of a surface mounting type device using a lead frame relating to the present invention for surface mounting on a print base plate 15, and FIG. 10 is a section view of a lead inserting type device using a lead frame relating to the present invention for mounting on a print base plate 15. For the device relating to the present embodiment, any of the packages described in the examples from 1 to 5 can be usable.

Especially, a higher efficiency is achievable by applying the present invention to a semiconductor chip having a large capacity of a chip size more than 100 mm$^2$. Further, by applying to a memory chip, a microprocessor, and a gate array having a capacity shown in the example 3, an ultra small type personal computer and a medium or small type computer for a banking terminal computer etc. can be obtained.

What is claimed is:

1. A lead frame for mounting a semiconductor chip comprising:
    an alloy layer covering a portion of said lead frame, wherein said alloy layer comprises
    a first metal selected from the group consisting of Mo, W, Au, Ag, Cu, Pt, Pd, Cr, Rh, Ru, Ir, and Os, and
    a second metal selected from the group consisting of Fe, Ni, and Co, and
    wherein said first metal is less than 30% by weight of said alloy layer.

2. A lead frame for mounting a semiconductor chip comprising:
    an oxide film covering a portion of said lead frame, wherein said oxide film comprises a complex oxide,
    a metal selected from the group consisting of Mo, W, and Cr, and
    an oxide of a basic metal of said lead frame.

3. A lead frame comprising:
    an alloy layer covering a surface of a basic metal of said lead frame,
    wherein said alloy layer includes
    a first metal selected from the group consisting of Mo, W, Au, Ag, Cr, Cu, Pt, Pd, Rh, Ru, Ir, and Os and
    a second metal at least selected from the group consisting of Fe, Co, and Ni, and
    wherein said first metal is less than 30% by weight of said alloy layer.

4. A lead frame comprising:
    a basic metal, an alloy layer covering a surface of said basic metal, wherein said alloy layer include
    a first metal selected from the group consisting of Mo, W, Au, Ag, Cr, Cu, Pt, Pd, Rh, Ru, Ir, and Os,
    a second metal selected from the group consisting of Fe, Ni and Co, and
    a third metal selected from the group consisting of Sn and Zn, and
    wherein said first metal is less than 30% by weight of said alloy layer, said third metal being less than 30% by weight of said alloy layer, and said second metal being a residual of said alloy layer.

* * * * *